United States Patent [19]

Ross, Jr. et al.

[11] Patent Number: 4,599,037
[45] Date of Patent: Jul. 8, 1986

[54] METHOD AND APPARATUS FOR MANIPULATING MINIATURE PARTS

[75] Inventors: Richard H. Ross, Jr.; Donald J. Longtin, both of Glastonbury, Conn.

[73] Assignee: United Technologies Corporation, Hartford, Conn.

[21] Appl. No.: 627,369

[22] Filed: Jul. 2, 1984

[51] Int. Cl.⁴ ............................................. B65G 69/00
[52] U.S. Cl. ...................................... 414/752; 29/740;
414/753; 414/786; 901/40; 901/37; 294/64.1
[58] Field of Search .................. 294/2, 64 R, 116, 65;
901/30, 31, 37, 32, 39, 36, 40, 45; 29/740, 741, 759; 414/751, 752, 753, 786

[56] References Cited

U.S. PATENT DOCUMENTS

| | | | |
|---|---|---|---|
| 3,344,900 | 10/1967 | Drop | 198/33 |
| 3,453,714 | 7/1969 | Clark et al. | 29/203 |
| 3,704,038 | 11/1972 | Glanemann | 294/65 |
| 4,135,630 | 1/1979 | Snyder et al. | 214/1 BT |
| 4,151,945 | 5/1979 | Ragard et al. | 228/6 |
| 4,290,732 | 9/1981 | Taki et al. | 414/752 |
| 4,327,482 | 5/1982 | Araki et al. | 29/740 |
| 4,381,601 | 5/1983 | Tamai et al. | 29/740 |
| 4,437,232 | 3/1984 | Araki et al. | 29/740 |
| 4,473,247 | 9/1984 | Itemadani et al. | 294/2 |
| 4,494,902 | 1/1985 | Kuppens et al. | 294/2 X |

Primary Examiner—Leslie J. Paperner
Assistant Examiner—Dennis Williamson
Attorney, Agent, or Firm—John Swiatocha

[57] ABSTRACT

A manipulator (10) including a compliant suction means (215 and 220) and two pairs of independently operable jaws (55, 60) precisely and delicately locates a workpiece (300) for delivery thereof to a location remote from that at which the piece is picked up.

16 Claims, 10 Drawing Figures

METHOD AND APPARATUS FOR MANIPULATING MINIATURE PARTS

DESCRIPTION

1. Technical Field

This invention relates to manipulators and particularly those used in robots for the automated manufacture of delicate, miniature components such as integrated circuits.

2. Background Art

The use of miniature, integrated circuits in electronic systems has gained widespread popularity in recent years. In the manufacture of the integrated circuits themselves, it has been the practice to mount prepared semiconductors on terminal boards in premachined slots provided therein. In efforts to reduce the cost of such integrated circuits, automated techniques in the production thereof are in widespread use. By way of example, the mounting of chips on terminal boards is often carried out in part by a manipulator, which collects the chips one at a time from a storage area, then transports the chips by an industrial robot to an area near the mounting board, precisely aligns the chips with appropriate mounting locations on the boards and then deposits the chips precisely at those locations. Those skilled in the art will appreciate that as the integrated circuit chips are increasingly miniaturized, such automated techniques become more and more difficult to carry out and acceptacle errors in locating the chips on the terminal boards diminish in magnitude. Furthermore, as chip size decreases through miniaturization, and as the chips take on diverse shapes, the chips become more and more fragile and difficult to handle and therefore, less able to tolerate the manipulation thereof by state of the art automated handling equipment.

Disclosure of Invention

It is among the objects of the present invention, to provide an improved manipulator for handling miniaturized, delicate workpieces such as semiconductor chips and the like and a method for using such a manipulator characterized by enhanced accuracy in the collection of the workpieces at one location and the deposit thereof at a remote location as well as a capability for delicately manipulating the workpieces with minimal risk of damage thereto. In accordance with one aspect of the present invention, a manipulator of the general type discussed hereinabove includes a compliant means for picking up a workpiece such as an integrated circuit chip by suction and two pairs of orthogonal jaws for positioning the workpiece with respect to the manipulator for deposit of the workpiece at a precise location. The compliancy of the suction means minimizes the risk of damage to the workpiece due to impact with the suction means as the workpiece is picked up. In accordance with another aspect of the present invention the jaws are individually operable whereby each pair of jaws is capable of locating a workpiece in a corresponding direction with controllable force and with minimal sliding contact between the workpiece and the jaws. In the preferred embodiment, the jaws are operated by individual pneumatic actuators, each pair of jaws being operated by a conically shaped cam driven by a corresponding actuator. The jaws are spring loaded in an open direction, the input power for jaw closing and hence the closing force applied to the workpiece by the jaws being conveniently controllable by modulating the input power to the jaw actuators. The individually operable orthogonal jaws are also particularly well suited for handling chips of rectangular and irregular shapes.

BRIEF DESCRIPTION OF DRAWINGS

FIGS. 6-10 are enlarged views of those portions of FIGS. 3-6 which illustrate the engagement of the manipulator with the workpiece.

BEST MODE OF CARRYING OUT THE INVENTION

Figure 1:
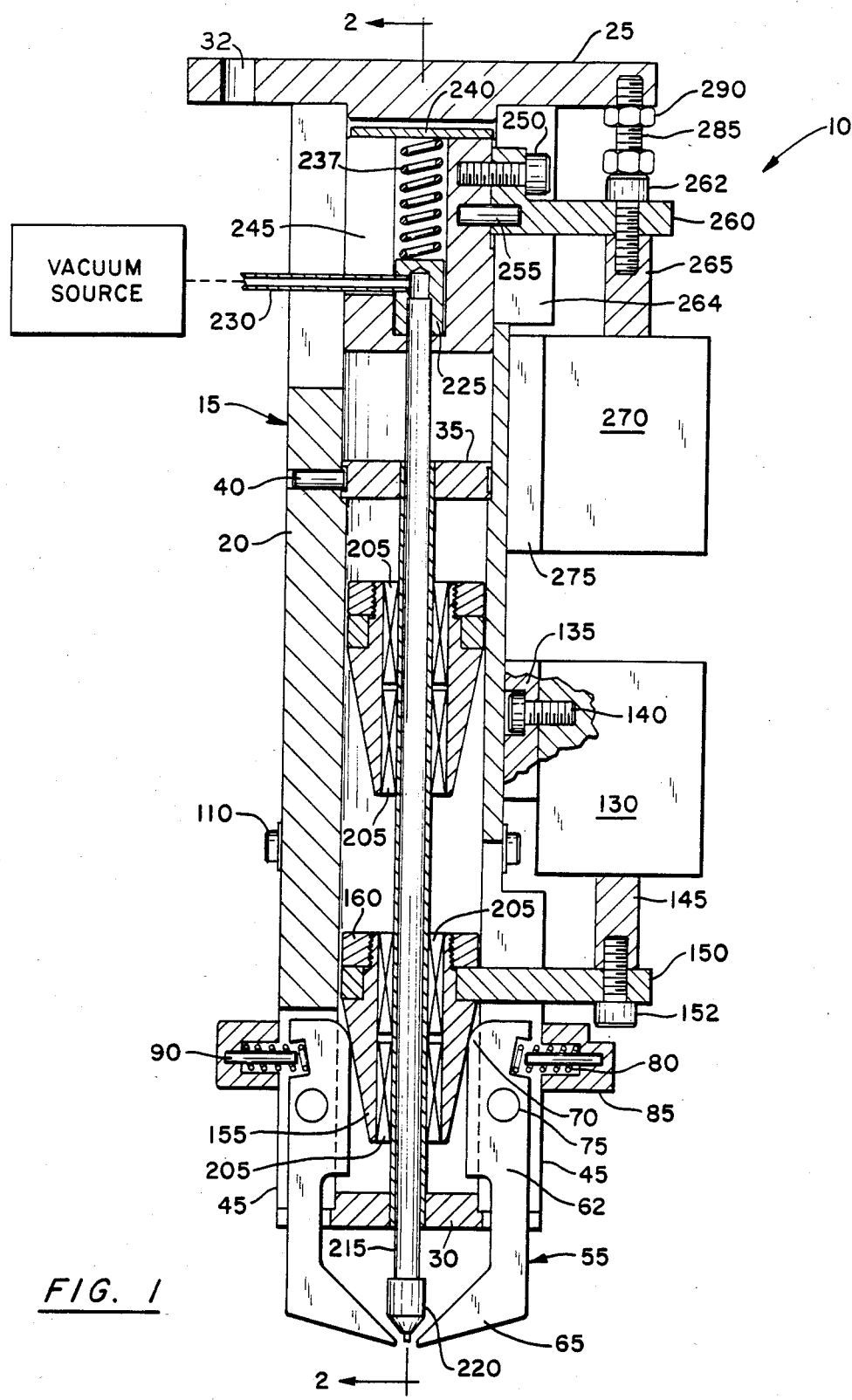
FIG. 1 is a partially sectioned side elevation of the manipulator of the present invention.
Figure 2:
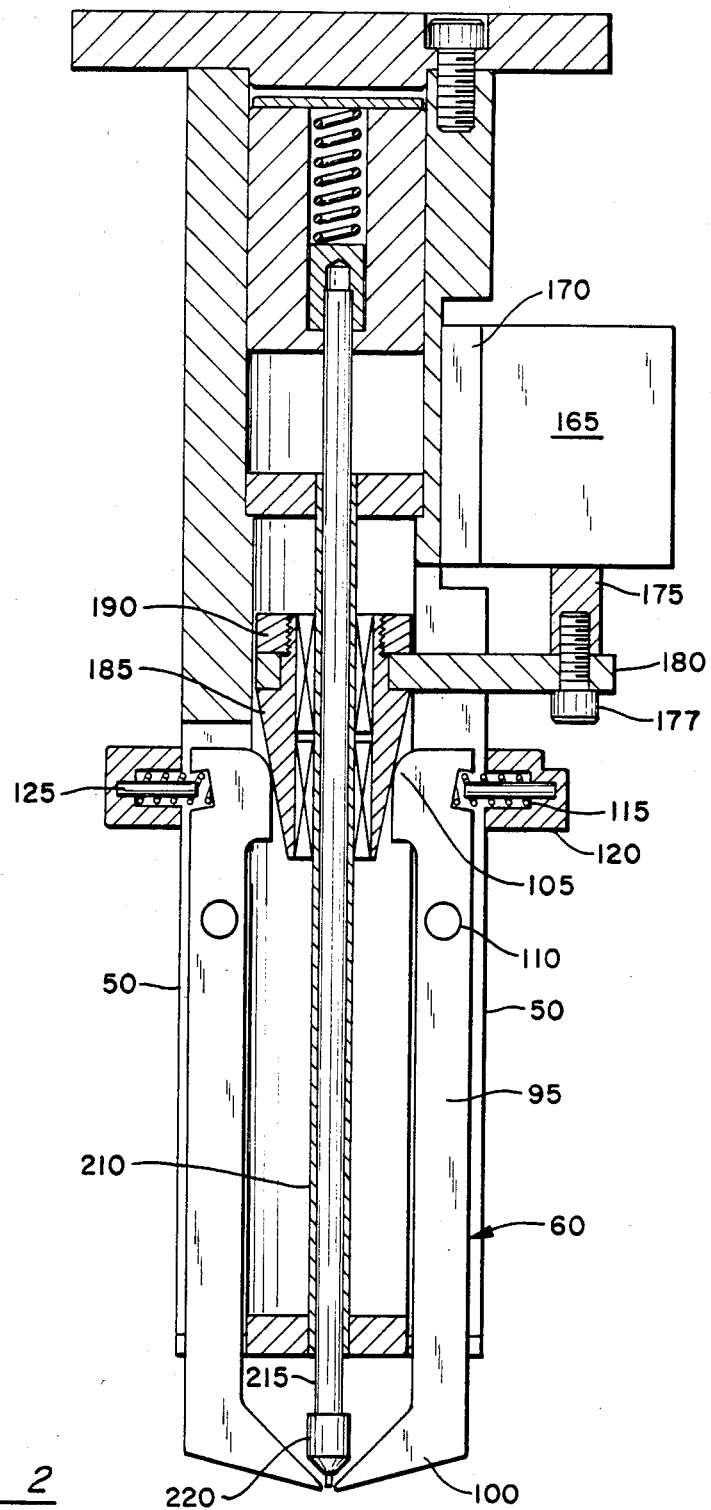
FIG. 2 is a partially sectioned side elevation of the manipulator taken in the direction of line 2—2 of FIG. 1.

Referring to FIGS. 1 and 2, the manipulator of the present invention is shown generally at 10 and comprises a frame 15 including an upstanding lateral portion 20 covered at the upper and lower ends thereof by upper and lower cover plates 25 and 30, respectively. The manipulator may be used with an industrial robot (not shown) which would transport the manipulator (and workpieces carried thereby) between locations of workpiece pickup and delivery and if so used, could be mounted to the robot at any suitable location on the frame such as at mounting holes, one of which is shown at 32 in cover plate 25. The frame also includes a medial plate 35 fixed to lateral portion 20 by one or more cap screws, one of which is shown at 40, plate 35 acting as a guide for a suction means to be described in greater detail hereinafter. Lateral portion 20 is slotted at 45 (FIG. 1) and 50 (FIG. 2) the slots accommodating outward pivotal movement of alignment jaw pairs 55 and 60.

As seen in the drawings, the jaw pairs are essentially similar. With regard to jaws 55, each comprises an upstanding leg 62 having an inwardly extending tooth 65 at the lower end thereof and an integral cam follower 70 at the inner corner of the upper end of the leg. Each of the jaws is pivotally mounted to the frame by a pin 75 and is biased inwardly (at the upper end thereof) in an opening direction by coil spring 80 received within cover 85 and maintained in alignment with the jaws and frame by pin 90. Similarly, as best seen in FIG. 2, each of jaws 60 includes an upstanding leg 95 having at the lower end thereof, an inwardly extending tooth 100 and, at the inner corner of the upper end of the leg, a cam follower 105. Each jaw is pivotally mounted to the frame by pin 110 and is biased inwardly, in an opening direction, by a spring 115 disposed within cover 120 and maintained in alignment with the jaws and frame by a pin 125.

Each pair of jaws is individually operable by its own motor (actuator). In the preferred embodiment, jaws 55 are operated by pneumatic motor 130 bolted to the frame at motor mounting plate 135 by bolts 140. An output shaft 145 of motor 130 is fastened to inwardly extending arm 150 by bolt 152. Arm 150 is apertured at the end thereof to receive therewithin a conically shaped cam 155 maintained in engagement with the arm by nut 160 threaded on the cam. Similarly, jaws 60 are operated by pneumatic motor 165 fixed to the frame at mounting plate 170 and having an output shaft 175 which is connected by bolt 177 to an inwardly extending arm 180 apertured at an end thereof to receive conically shaped cam 185. Cam 185 is attached to the apertured end of this arm by a nut 190 threaded on the cam. Both cams 155 and 185 are provided interiorly thereof with bearings (such as ball bearings) 195 press fit therewithin. The bearings ride on an upstanding tubular guide 210 attached to frame plates 30 and 35 by any suitable technique such as welding, bonding, or the like.

As illustrated, the conical cams engage follower portions 70 and 105 of jaws 55 and 60. It will be seen that from the positions illustrated, downward movement of the cams will cause further closing of the jaws while upward movement of the cams will allow the jaws to open under the influence of coil springs 80 and 115. Thus, it will be appreciated that the closing force on any workpiece held between the jaws can be conveniently controlled by controlling the output of the pneumatic motors thereby modulating the magnitude of the forces from the cams which oppose the opening forces provided by the springs. Individual operability of the orthogonal jaws also facilitates the handling of workpieces of rectangular or irregular shapes.

A conduit (tube) 215 is slidably received within tubular guide 210 and includes at the end thereof, a suction nozzle 220 attached thereto by bonding or any similar technique. As shown, the suction nozzle extends below the frame to a location in proximity to the ends of the jaw teeth, generally centrally thereof. The opposite end of conduit 215 connects to a block 225 having an L-shaped passage drilled therein, the passage being connected to tube 230 which connects at the other end thereof to a suitable vacuum source 235. Block 225 is biased downwardly by a coil spring 237 disposed between the block and the cover 240 of a larger block 245 within which block 225 is slidably disposed. Block 245 is slidably disposed within frame 15 and attached by screw 250 and pin 255 to an L-shaped arm 260 extending through slot 264 in frame 15 and attached by bolt 262 to an output shaft 265 of a third pneumatic motor 270. Motor 270 is attached to the frame at mounting plate 275. Bolt 262 engages bolt 285 fixed to mounting plate 25 by nut 290, bolt 285 acting as a stop for arm 260. It will be seen that vertical, rectilinear movement of output shaft 265 will move tube 215 and nozzle 220 for pickup and delivery of a workpiece at predetermined locations. The arrangement of spring 235 above block 225 functions as a shock mount for block 225, absorbing the energy of impact between the workpiece and nozzle 220 when the nozzle engages the workpiece in picking the workpiece up.

Figure 3:
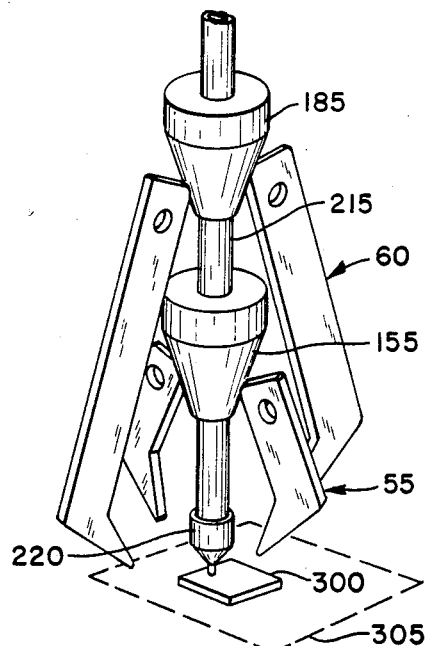
FIGS. 3-6 are simplified isometric views of a portion of the manipulator going through a sequence of picking up a workpiece, transporting the workpiece and delivering the workpiece to a specified location.
Figure 4:
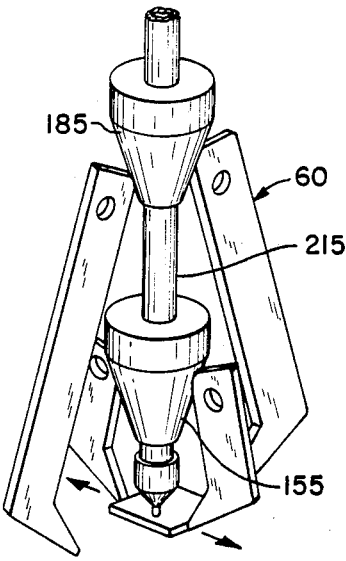
Figure 7:
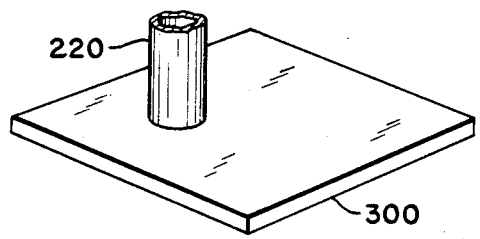
Figure 8:
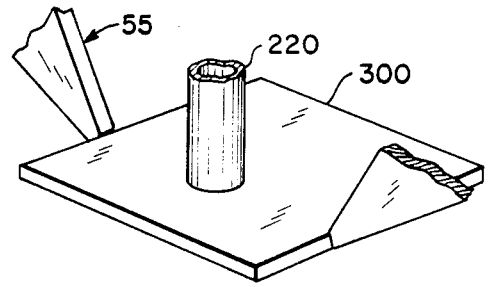
Figure 5:
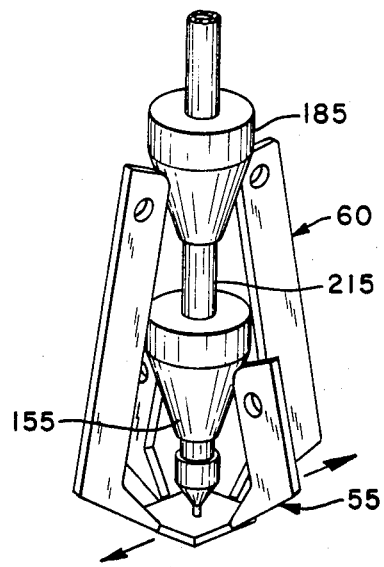
Figure 6:
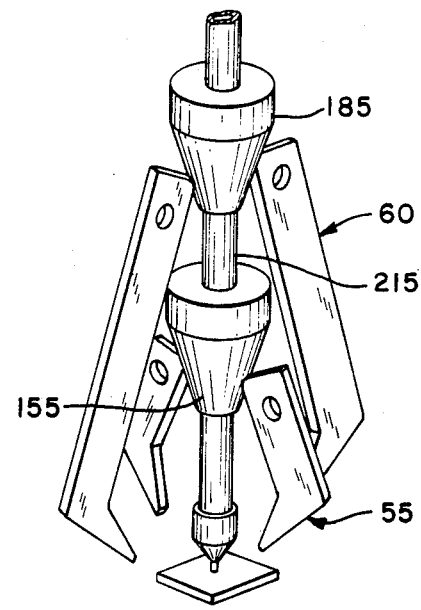
Figure 9:
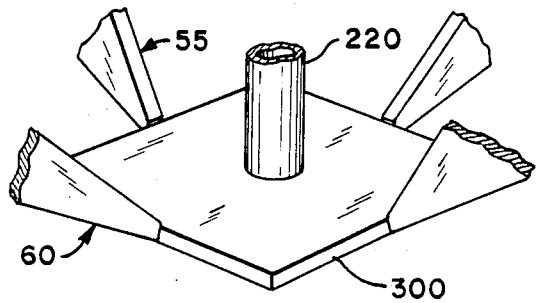
Figure 10:
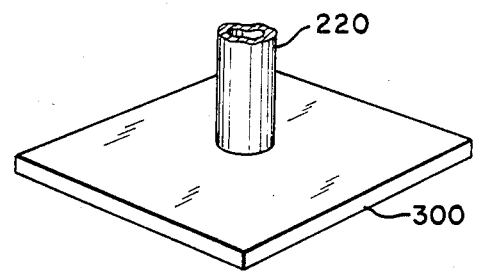

Referring to FIGS. 3-10, it will be apparent that manipulator 10 is quite useful as an accessory to an industrial robot which picks up workpieces such as miniature integrated circuit chips at a first general location transports the chips to a remote second location such as a terminal board, and deposits the workpieces at a precise point at the second location such as a mounting slot on the terminal board. Referring to FIGS. 3 and 7, a workpiece 300 is located with no particular precision within a first general location such as a depository of such pieces indicated by phantom line 305. The robot (not shown) positions manipulator 10 over workpiece 300 and actuator 270 lowers suction nozzle 220 into contact with the workpiece, spring 235 absorbing much of the impact energy therebetween. When contact has been made and suction applied to the workpiece, actuator 270 raises tube 215 and nozzle 220 thereby lifting the workpiece. As the workpiece is picked up by the suction nozzle, jaws 55 and 60 are held open by the biasing force of coil springs 80 and 115. When the workpiece reaches a prescribed height, cam 155 is lowered (FIG. 4) causing jaws 55 to close on the workpiece thereby locating the workpiece in one horizontal direction with respect to the manipulator. When the workpiece has been located in the first horizontal direction, cam 185 is then lowered (FIG. 5) causing jaws 60 to close on the workpiece to locate it in a second horizontal direction perpendicular to the first direction. Once the workpiece has been located in both horizontal directions, the vacuum is removed from tube 230 and suction nozzle 220 is raised from the workpiece disengaging itself therefrom to relieve any bending stresses within the tube. The unstressed tube is then lowered so that nozzle 220 reengages the workpiece for lowering the workpiece (below the plane of the jaw teeth) (FIG. 6) to the precise location of the mounting slot with little or no interference from the teeth.

It will thus be appreciated that the manipulator of the present invention is capable of picking up a workpiece and delicately repositioning the workpiece for delivery to a remote second location. The compliancy of the suction tube mount absorbs much of the energy of impact between the nozzle and the workpiece thereby minimizing the risk of damage to the workpiece from such impact. The independent operability of the orthogonal jaws not only enables the workpiece to be positioned in the horizontal plane with controllable jaw force to reduce the risk of damage to the workpiece from impact with the jaws, but also facilitates manipulation of rectangular and irregularly shaped workpieces. Moreover, sequentially positioning the workpiece first in one horizontal direction and subsequently in another direction allows the piece to be horizontally located with sliding contact between the workpiece and one of the two jaw pairs. Thus, by orienting the workpiece ao that the first jaws contact the workpiece at the more durable of the edges thereof, the more fragile edges are gripped by the second jaws without further sliding contact between the workpiece and the second jaws to further reduce the risk of damage to the workpiece by the manipulator. In the method of use of the manipulator discussed hereinabove, disengagement of the suction nozzle with the workpiece and reengagement of the nozzle therewith, all subsequently to the horizontal positioning of the workpiece, enhances the accuracy with which the workpiece may be located at the second location since the suction tube is relieved of all bending stresses therein prior to disengagement of the jaws with the workpiece and delivery of the workpiece by the suction tube. Release of the workpiece below the plane of the jaw teeth minimizes the interference of the teeth with the deposit of the workpiece at the receiving location.

While a particular embodiment of the manipulator and the method of use thereof has been disclosed herein, it will be appreciated that this disclosure will suggest various alternate embodiments of the invention to those skilled in the art. For example, cams and jaws of different shapes and actuators powered by sources other than air may be employed without departing from the present invention. Likewise, while the manipulator has been described as being transported from one location to another by a robot, it will be appreciated that the manipulator may remain stationary and alternate depositories of workpieces and mounting boards may be moved past the manipulator as by a conveyor belt or the like. Similarly, the suction tube may be made from a resilient material for horizontal, as well as vertical compliancy. Therefore, it is intended by the following claims to cover these and any other modifications which will, from the disclosure herein, suggest themselves to those skilled in the art.

Having thus described the invention, what is claimed is:

1. A manipulator for collecting parts from a first location for transport to, and deposit precisely at a remote, second location, said manipulator being characterized by:
    a frame;
    a suction means carried by said frame and including a nozzle for engaging said parts and restraining said parts from movement in a first direction;
    a first pair of jaws which open and close in a second direction, said first pair of jaws being carried by said frame and operable by an actuator, for locating said parts in said second direction; and
    a second pair of jaws which open and close in a third direction, said second pair of jaws being carried by said frame and operable by another actuator independently from said first pair of jaws for locating said parts in said third direction, whereby said jaws are capable of locating parts of diverse shape in said second and third directions with controllable force and minimal sliding contact between said part and said jaws.

2. The manipulator of claim 1 characterized by said first, second and third directions being mutually orthogonal.

3. The manipulator of claim 1 characterized by said actuators being pneumatic.

4. The manipulator of claim 1 characterized by a spring interposed between said suction means and said frame, said spring rendering said suction means compliant.

5. The manipulator of claim 1 characterized by said first and second pairs of jaws being pivotally mounted on said frame and operated by first and second cams, respectively, said first and second cams being mounted on said frame and individually powered by first and second motors, respectively.

6. The manipulator of claim 5 characterized by said first and second motors being pneumatic.

7. The manipulator of claim 5 characterized by each jaw of said first and second jaw pairs being provided thereon with an integral cam follower engageable by a respective one of said first and second cams for closing said jaws.

8. The manipulator of claim 7 characterized by said jaws being biased open, the closing force on said jaws being modulatable by the regulation of the power input to said cams by said motors.

9. The manipulator of claim 8 characterized by said jaws being biased open by springs mounted on said frame.

10. The manipulator of claim 5 characterized by said first and second cams having generally conically-shaped surfaces.

11. The manipulator of claim 5 characterized by said frame including an elongate guide extending interiorly of said frame in said first direction and by said first and second cams being coaxially mounted on said guide for reciprocal movement therealong.

12. The manipulator of claim 11 characterized by said guide being hollow and by said suction means comprising a tube received within said guide for reciprocal movement with respect thereto.

13. A method of transporting a part by a manipulator from a first, general location to a second, specific location at which said part is deposited, said method being characterized by the steps of:
    picking up said part with a suction means by engagement therewith and restraining said part in a first direction by said suction means;
    locating said part in a second direction with respect to said manipulator while maintaining the engagement of said part with said compliant suction means;
    subsequently locating said part in a third direction with respect to said manipulator while maintaining the engagement of said part with said compliant suction means;
    releasing said part from said compliant suction means to relieve any bending stresses therein while said part remains restrained by said gripping jaws;
    subsequently re-engaging said part with said compliant suction means for delivery thereby to said second location; and
    releasing said part from said compliant suction means at said second location for deposit thereat.

14. The method of claim 13 characterized by said part being located in said second and third directions by independently operable gripping jaws.

15. The method of claim 14 characterized by said suction means lowering said part below said jaws for subsequent release of said part at said second location by said suction means with minimal interference from said jaws.

16. The method of claim 13 characterized by said first, second and third directions being mutually orthogonal.

* * * * *